(12) United States Patent
Trimberger

(10) Patent No.: US 7,138,827 B1
(45) Date of Patent: Nov. 21, 2006

(54) PROGRAMMABLE LOGIC DEVICE WITH TIME-MULTIPLEXED INTERCONNECT

(75) Inventor: Stephen M. Trimberger, San Jose, CA (US)

(73) Assignee: Xilinx, Inc., San Jose, CA (US)

(\*) Notice: Subject to any disclaimer, the term of this patent is extended or adjusted under 35 U.S.C. 154(b) by 50 days.

(21) Appl. No.: 10/810,034

(22) Filed: Mar. 26, 2004

Related U.S. Application Data

(62) Division of application No. 10/253,740, filed on Sep. 23, 2002, now Pat. No. 6,829,756.

(51) Int. Cl.
   *H03K 19/177* (2006.01)

(52) U.S. Cl. .......................... 326/41; 326/38

(58) Field of Classification Search ............ 326/37–41, 326/47, 101
See application file for complete search history.

(56) References Cited

U.S. PATENT DOCUMENTS

| | | | |
|---|---|---|---|
| 5,426,378 A | 6/1995 | Ong | |
| 5,583,450 A | 12/1996 | Trimberger et al. | |
| 5,701,441 A | 12/1997 | Trimberger | |
| 5,761,483 A | 6/1998 | Trimberger | |
| 5,825,662 A | 10/1998 | Trimberger | |
| 5,886,900 A | 3/1999 | Gascoyne et al. | |
| 5,914,616 A * | 6/1999 | Young et al. | 326/41 |
| 5,963,050 A * | 10/1999 | Young et al. | 326/41 |
| 6,100,715 A * | 8/2000 | Agrawal et al. | 326/39 |
| 6,191,611 B1 * | 2/2001 | Altaf | 326/39 |
| 6,362,646 B1 * | 3/2002 | Schleicher | 326/40 |
| 6,510,530 B1 * | 1/2003 | Wu et al. | 714/30 |
| 6,526,559 B1 * | 2/2003 | Schiefele et al. | 716/16 |

\* cited by examiner

*Primary Examiner*—Vibol Tan
(74) *Attorney, Agent, or Firm*—Thomas A. Ward

(57) ABSTRACT

A PLD includes at least one portion of the programmable interconnect that can be time multiplexed. The time multiplexed interconnect allows signals to be routed on shared interconnect at different times to different destinations, thereby increasing the functionality of the PLD. Multiple sources can use the same interconnect at different times to send signals to their respective destinations. To ensure proper sharing of the interconnect, the sources can include selection devices (such as multiplexers), and the destinations can include capture devices (such as flip-flops), wherein the selection devices and the capture devices are controlled by the same time multiplexing signal. To optimize the time multiplexing interconnect, as much of the same interconnect is shared as possible.

20 Claims, 8 Drawing Sheets

PROGRAMMABLE LOGIC DEVICE WITH TIME-MULTIPLEXED INTERCONNECT

This application is a DIV of Ser. No. 10/253,740 filed Sep. 23, 2002, now U.S. Pat. No. 6,829,756.

BACKGROUND OF THE INVENTION

1. Field of the Invention

This invention relates generally to programmable logic devices, and in particular to a system and method for time multiplexing the programmable interconnect of a field programmable gate array.

2. Description of the Related Art

Programmable logic devices such as field programmable gate arrays ("FPGAs") are a well-known type of integrated circuit and are of wide applicability due to the flexibility provided by their, reprogrammable nature. An FPGA typically includes an array of configurable logic blocks (CLBs) that are programmably interconnected to each other to provide logic functions desired by a user (a circuit designer). An FPGA typically includes a regular array of identical CLBs, wherein each CLB is individually programmed to perform any one of a number of different logic functions. These functions may include logic in lookup tables (LUTs) and storage in flip-flops or latches. The FPGA may also include tri-state buffers that users may use to share routing wires. The FPGA has a configurable routing structure called a programmable interconnect (hereinafter interconnect) for interconnecting the CLBs according to the desired user circuit design. The FPGA also includes a number of configuration memory cells which are operatively coupled to the CLBs to specify the function to be performed by each CLB, as well as to the interconnect to specify the coupling of the input and output lines of each CLB.

One approach available in the prior art to increase the functionality of logic circuits has been increasing the number of CLBs and interconnect structures in the FPGA. However, for any given semiconductor fabrication technology, there are limitations to the number of CLBs that can be fabricated on an integrated circuit chip of practical size. Thus, there continues to be a need to increase the number of logic gates or CLB densities for FPGAs.

Because the chip area of programmable logic devices is dominated by interconnect area, methods have been proposed for sharing this interconnect. In one approach, a user uses tri-state buffers or multiplexers to place different signals into a wire at different times. The user can build circuitry in the programmable logic to control the tri-state buffers or multiplexers, and to capture the desired signals at their destination. Unfortunately, this method requires a significant amount of programmable logic and interconnect resources which may be greater than the amount saved by sharing the interconnect.

Another approach to increase the functionality of logic circuits has been the reconfiguration of the FPGA. Unfortunately, this reconfiguration requires the time consuming step of reloading a configuration bit stream for each reconfiguration. Moreover, reconfiguration of an FPGA generally requires suspending the implementation of the logic functions, saving the current state of the logic functions in a memory device external to the FPGA, reloading the entire array of memory configurations cells, and inputting the states of the logic functions, which have been saved off chip along with any other needed inputs. Each of these steps requires a significant amount of time, thereby rendering reconfiguration impractical for implementing typical circuits.

Yet other approaches to increase the complexity and size of logic circuits have been to time multiplex the FPGA using additional configuration memory cells. Specifically, one configuration memory cell typically controls each programming point on an FPGA. FIG. 1 illustrates an exemplary configuration memory cell 100, which includes a conventional latch 101 operatively coupled to a select transistor 102. Configuration memory cell 100 can be loaded with configuration data 105 via select transistor 102, which is controlled by a configuration select signal 104. Once loaded into latch 101, configuration data 105 can be provided to CLB and interconnect logic 103.

In one exemplary time multiplexing approach described in U.S. Pat. No. 5,426,378, at least first and second arrays of configuration memory cells can be provided. For example, FIG. 2 illustrates a switching device (e.g. a multiplexer) 206 receiving inputs from a first configuration array 201 and a second configuration array 202. In one embodiment, a user's clock 204 can be divided into two phases. During a first phase, the configuration data in first configuration array 201 can be used, thereby configuring a CLB and interconnect matrix 205 in a first configuration. During a second phase, the configuration data in second configuration array 202 can be used, thereby configuring CLB and interconnect matrix 205 in a second configuration. In this embodiment, a third configuration array 203 can be provided, wherein the configuration data stored in this array does not change during reconfiguration. In this manner, where each CLB could previously implement one logic function during a cycle of the user's clock, each CLB can now implement two logic functions during the same cycle.

In another exemplary time multiplexing approach described in U.S. Pat. No. 5,583,450, each memory cell can be replaced with a random access memory (RAM) bit set. For example, FIG. 3 illustrates a bit set 300 that includes eight memory cells MC1–MC8. Each memory cell MC has a latch 301 and an associated select transistor 302. Memory cells MC1–MC8 are coupled to receive configuration data 303 and provide signals to a clocked latch 304.

In one embodiment, the configuration bits at the same memory cell location in each bit set on the FPGA are read out simultaneously to update the configuration of the CLBs and interconnect, thereby causing the CLBs to perform different logical functions and the interconnect to make different connections. In other words, by providing a bit set with eight memory cells for each FPGA programming point, an FPGA can effectively provide eight configurations. By reconfiguring the CLBs, the number of function generators in the CLB, typically conventional look up tables ("real LUTs"), needed to implement a given number of LUTs in a user circuit ("virtual LUTs") are reduced by a factor of the number of configurations.

In either time multiplexing approach, the additional configuration memory cells increase logic density by dynamic re-use of the FPGA circuitry. Specifically, CLBs and interconnect are configured to perform some defined task at one instant and are reconfigured to perform another task at another instant. However, these additional configuration memory cells can cause significant complexity in their programming as well as in their operation. Moreover, these additional configuration memory cells can also undesirably take up significant silicon area. For example, a typical CLB could include between 360 and 564 programming points, wherein each programming point would be implemented by a bit set (e.g. bit set 300). Thus, instead of being configured by 360 to 564 memory cells in a non-time multiplexed FPGA, each CLB could be configured by as many as 4512 memory cells. (Note that this count can include many memory cells that are actually located in the interconnect, but are associated with a CLB.) Therefore, although offering significant advantages in logic density, a time multiplexed FPGA can have an unacceptable cost in silicon area.

Therefore, a need arises for a system and method of increasing functionality of an FPGA while minimizing silicon resources.

SUMMARY OF THE INVENTION

Programmable interconnect can encompass a majority of the area on a programmable logic device. However, particularly in a dense logic design, the use of the programmable interconnect can be heavily taxed. Therefore, sharing of this interconnect without significant degradation in performance is highly desirable.

In accordance with one feature of the invention, a programmable logic device includes at least one portion of the programmable interconnect that can be time multiplexed. Of importance, the configuration of that time multiplexed programmable interconnect is static. In other words, no additional configuration memory is needed to implement the time multiplexed interconnect. As noted above, duplication of configuration memory is highly undesirable due to size and programming considerations. The time multiplexed interconnect allows signals to be routed on shared interconnect at different times to different destinations, thereby increasing the functionality of the programmable logic device.

The configured programmable logic device can include a plurality of configurable logic blocks. A first set of configurable logic blocks includes multiple signal sources coupled to a selection device. A second set of configurable logic blocks includes multiple capture devices and corresponding signal destinations. The configured programmable logic device further includes a programmable interconnect coupled to the plurality of configurable logic blocks according to a design. At least one portion of the programmable interconnect couples the selection device and the multiple capture devices. The configured programmable logic device further includes a time multiplexing signal generator operatively coupled to the selection device and the capture devices. The time multiplexing signal generator controls which of the multiple signal sources provides its signal to a corresponding signal destination.

In one embodiment, to provide this configured programmable logic device, a netlist can be analyzed for signals having certain characteristics. For example, the characteristics can include the physical signal sources located in substantially the same area in the programmable logic device. A set of nets carrying such signals can be merged into a shared interconnect portion. The netlist can then be altered based on the new shared interconnect portion. At this point, the design represented by the altered netlist can be placed and routed. Then, phases of a time multiplexed clock can be selected for the signal sources and corresponding destinations.

In another embodiment, to provide this configured programmable logic device, an initial placement of a design to be implemented by the programmable logic device can be performed. The nets that exhibit locality based on the initial placement can be identified. The nets can be merged into a shared interconnect portion. The design can be altered accordingly. At this point, the design can be placed and routed. Then, phases of a time multiplexed clock can be selected for the signal sources and corresponding destinations.

In either embodiment, the shared interconnect portion can be driven by a first signal (generated by a first signal source) on a first phase and a second signal (generated by a second signal source) on a second phase. At the destinations, the capture devices can include latches controlled by the time multiplexing signal generator to selectively capture the first and second signals on different phases, i.e. either phase 1 or phase 2. In other words, a first destination can capture the first signal on the first phase and a second destination can capture the second signal on the second phase. Other embodiments of the invention can include any number of signal sources and signal destinations.

To optimize the time multiplexing interconnect, as much of the same programmable interconnect is shared as possible. Additional programmable interconnect is used as necessary to connect the shared portion of the programmable interconnect to the signal destinations.

Advantageously, the selection and capture devices take up few silicon resources on the programmable logic device while facilitating the time multiplexing of the interconnect.

DETAILED DESCRIPTION OF THE FIGURES

In accordance with one feature of the invention, the interconnect of the FPGA can be time multiplexed without additional configuration memory cells for interconnect resources. Specifically, designated sources of signals can use common sections of the interconnect at different times to send their signals to their respective destinations. This sharing of the interconnect can advantageously reduce the need for interconnect (or at least additional interconnect), thereby conserving one of the most expensive resources on the FPGA.

Figure 4A:
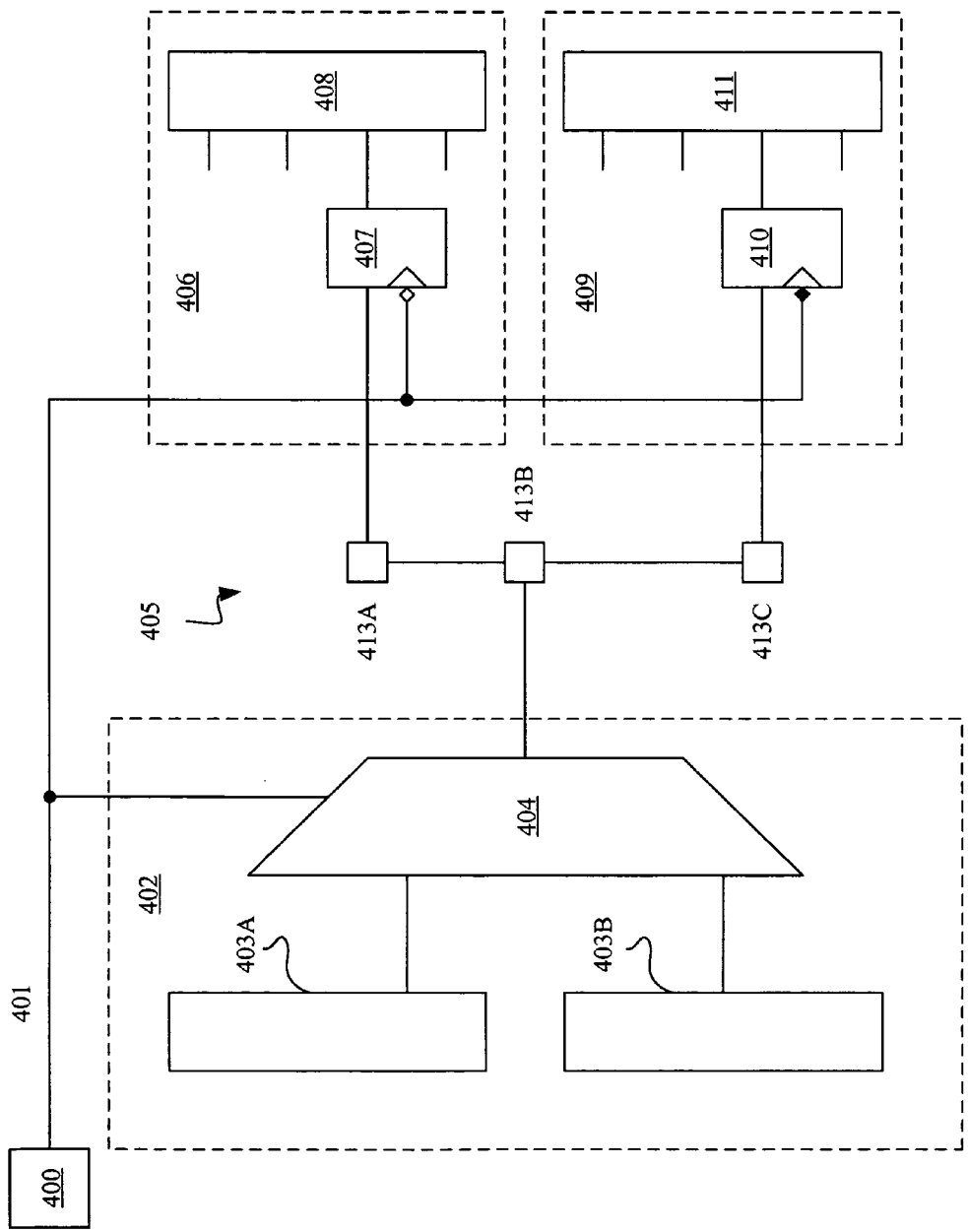
FIG. 4A illustrates one embodiment of the invention in which sources in a CLB can share sections of the interconnect to provide signals to multiple CLBs.

FIG. 4A illustrates one embodiment of the invention in which sources in a CLB can share portions of the interconnect to provide signals to multiple CLBs. In this embodiment, the sources 403A and 403B comprise look-up tables (LUTs), which typically implement the function generators in an FPGA. A selection device 404, e.g. a multiplexer or another switching component, can receive signals from sources 403A and 403B and selectively drive one of those signals onto interconnect 405, which can include multiple programmable interconnect points 413A–413C.

In this embodiment, the shared portion of interconnect 405 includes the segment from selection device 404 to programmable interconnect point 413B. Non-shared portions of interconnect 405 include segments from programmable interconnect point 413B to programmable interconnect points 413A and 413C as well as segments from interconnect points 413A and 413C to respective destinations 406 and 409. Note that the segments shown in FIG. 4A are illustrative only and are not intended to infer either length or programmable interconnect point restrictions. In other words, in an actual implementation, the number of segments, both shared and non-shared, can be more or less than that shown in FIG. 4A. Moreover, the number of programmable interconnect points in an actual embodiment can be more or less than those shown in FIG. 4A.

The interconnect is generally considered the most expensive resource of an FPGA. Therefore, advantages associated with time multiplexing of the interconnect can be directly related to the amount of shared interconnect. For example, an ability to share any interconnect can advantageously improve routing congestion in a densely packed logic design. Further, the FPGA base can be made more cheaply because less total interconnect is required to successfully route the design. Thus, in accordance with one feature of the invention, the shared portion of the interconnect can be maximized, thereby ensuring the most advantages from time multiplexing of the interconnect.

Each destination can include a capture device for determining when a signal is latched and used by the destination. For example, destinations 406 and 409 can include flip-flops 407 and 410, respectively, which can be controlled by a time multiplexing (TM) signal 401. TM signal generator 400, which generates TM signal 401, can be simple or complex, but must indicate the phase or the transitions between phases. In this manner, sources and destinations can synchronize when a value is being placed on the shared interconnect and when it is used. A simple TM signal generator could include a single A/B switch signal (where A and B are two different signal time slices) for 2:1 multiplexing. Another TM signal generator could include a multi-bit phase bus. In another embodiment, the TM signal generator could include a simple clock signal with a global reset signal indicating a first phase to synchronize all sources. Note that in this embodiment, the sources and destinations would need to separately determine the current time-multiplexed phase by using a counter or some other means.

The use of TM signal 401 will now be described in further detail. Specifically, during a first phase in which TM signal 401 is a first logic state, TM signal 401 can select an output signal from source 403A (via selection device 404) to be latched by flip-flop 407. During a second phase in which TM signal 401 is a second logic state, TM signal 401 can select an output signal from source 403B (also via selection device 404) to be latched by flip-flop 410.

Note that the diamond on the clock input to the flip-flop indicates an optional inversion controlled by a configuration memory cell. For example, flip-flop 407 could use a non-inverted clock (as shown by the open diamond), whereas flip-flop 410 could use an inverted clock (as shown by the filled diamond).

In this embodiment although the capture devices (i.e. flip-flops 407 and 410) receive the same signal (i.e. on their D input terminals), only one capture device can capture that signal (i.e. provide the signal on its Q output terminal) during any phase. In other embodiments, capture devices in multiple destinations can latch the same signal during at least one phase. The latched signal can be provided to any component in the CLB. For example, in FIG. 4A, the latched signals from flip-flops 407 and 410 can be provided to LUTs 408 and 411, respectively. Other latched signals may control user flip-flops (see, for example, the two flip-flops shown in FIG. 6) for clock enables and resets, as well as carry logic (see, for example, the multiplexers associated with the CIN and COUT values) or write enable circuitry for memory. Note that if a particular destination does not use time multiplexing, then the appropriate capture device can be set to an "always PASS", thereby allowing that destination to receive signals on any phase.

Figure 4B:
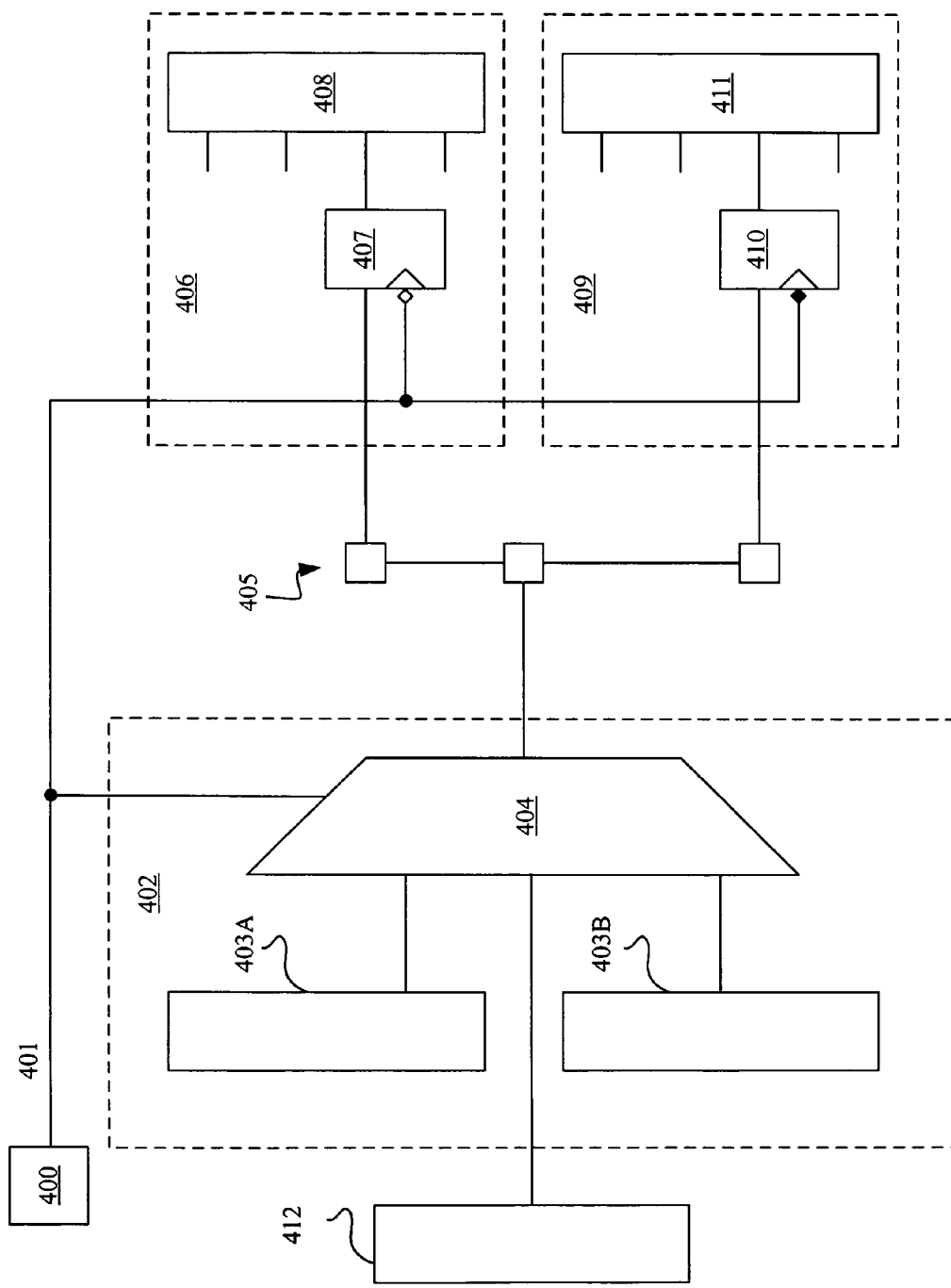
FIG. 4B illustrates another embodiment of the invention in which at least one source in a CLB and at least one source outside the CLB can share sections of the interconnect to provide signals to multiple CLBs.

Of importance, the number of multiplexed sources, the size of the selection device (e.g. multiplexer 404), the type of capture device (e.g. flip-flops 407 and 410), and the TM signal generation (e.g. providing TM signal 401) can vary from one embodiment to another. For example, FIG. 4B illustrates another embodiment of the invention in which at least one source in a CLB and at least one source outside the CLB can share sections of the interconnect to provide signals to multiple destinations. In this embodiment, in addition to sources 403 within CLB 402, another source 412, which is external to CLB 402, can provide its output signal to selection device 404. Thus, TM signal 401 could include multiple signals to control selection device 404 (e.g. a 3:1 multiplexer) and capture devices 407 and 410. Of course, TM signal 401 would need to indicate three phases, which can be accomplished by making it a multiple-bit bus.

Figure 4C:
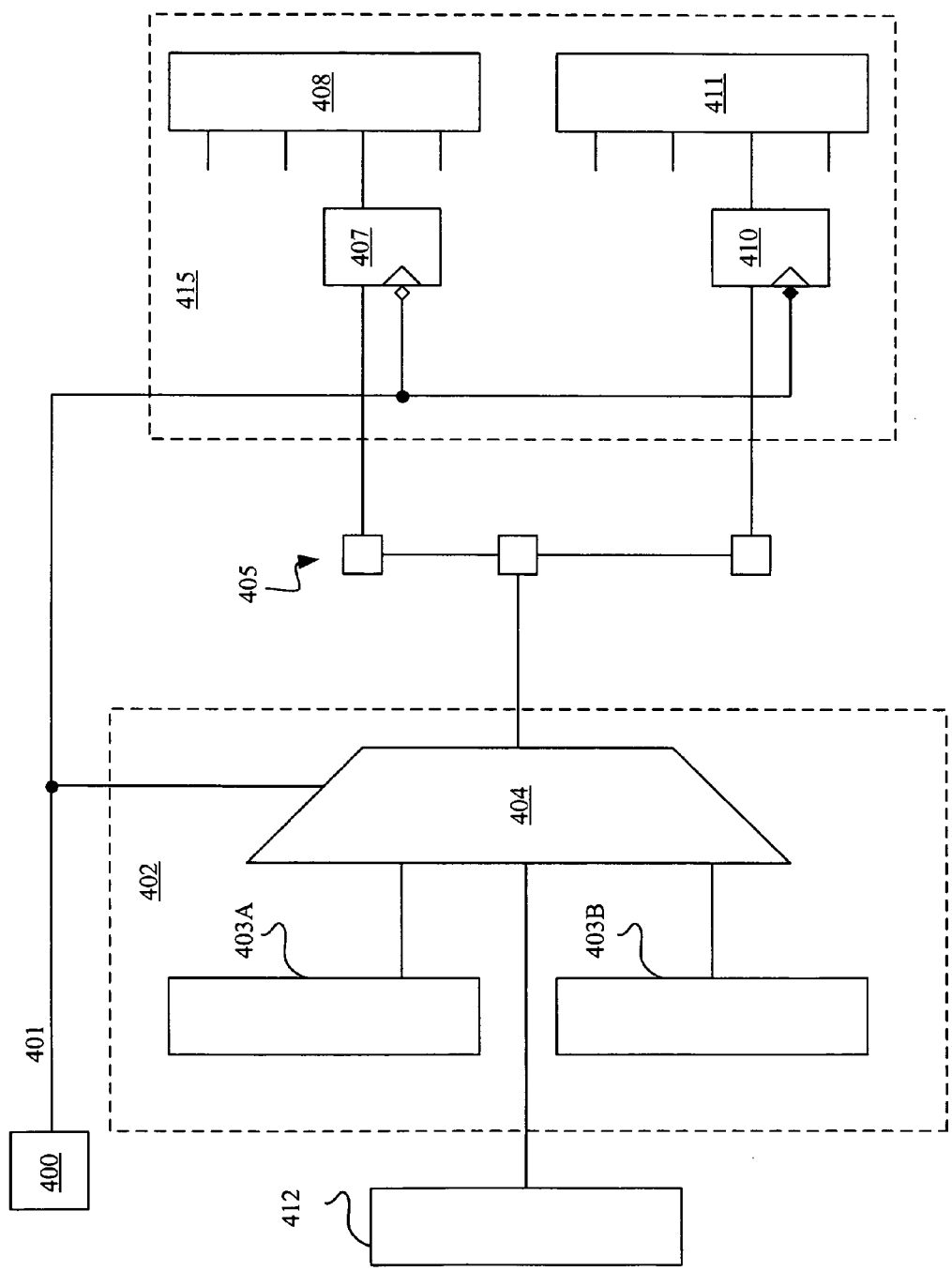
FIG. 4C illustrates yet another embodiment of the invention in which multiple sources, in the same CLB or different CLBs, can share sections of the interconnect to provide signals to the same CLB.

Note that the destinations can be located in different CLBs or even within the same CLB. For example, FIG. 4C illustrates yet another embodiment of the invention in which multiple sources can share sections of the interconnect to provide signals to the same CLB. Specifically, sources 403A, 403B, and 412 share portions of interconnect 405 to provide their signals to a CLB 415. As described in reference to FIG. 5, the grouping of sources and destinations can improve the efficiency of time multiplexing the interconnect.

In one embodiment of the invention, selection devices can be provided in a predetermined set of the CLBs. Fortunately, selection devices, such as multiplexers, expend few silicon resources and therefore can be liberally placed in the CLBs without significant area impact. Therefore, in light of the minimal area impact of the selection devices and their potential to reduce signal congestion in high-density logic by facilitating time multiplexing of the interconnect, a selection device is preferably provided in each CLB of the FPGA.

Figure 1:
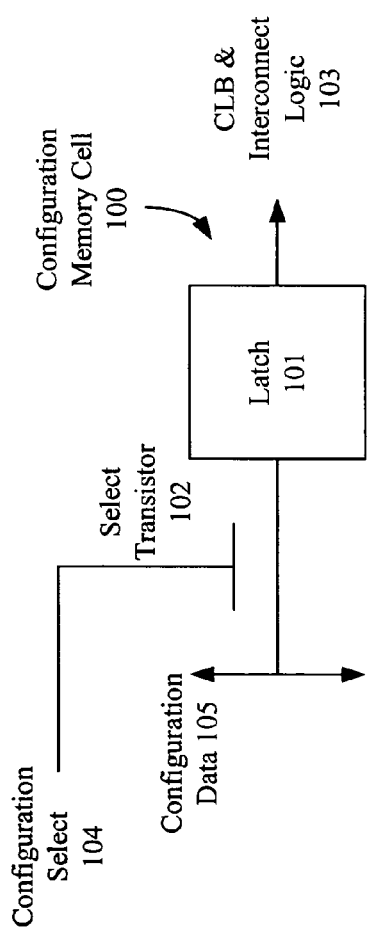
FIG. 1 illustrates an exemplary configuration memory cell, which includes a conventional latch operatively coupled to a select transistor.
Figure 2:
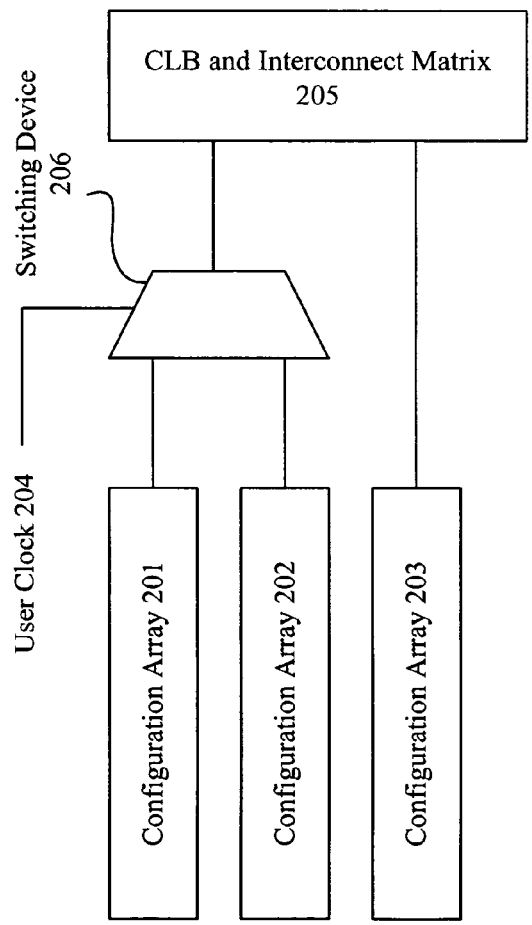
FIG. 2 illustrates a time multiplexing approach for switching between two configurations. During a first phase of user's clock, the configuration data in a first configuration array can be used, thereby configuring a CLB and interconnect matrix in a first configuration. During a second phase of the user's clock, the configuration data in a second configuration array can be used, thereby configuring the CLB and interconnect matrix in a second configuration.
Figure 3:
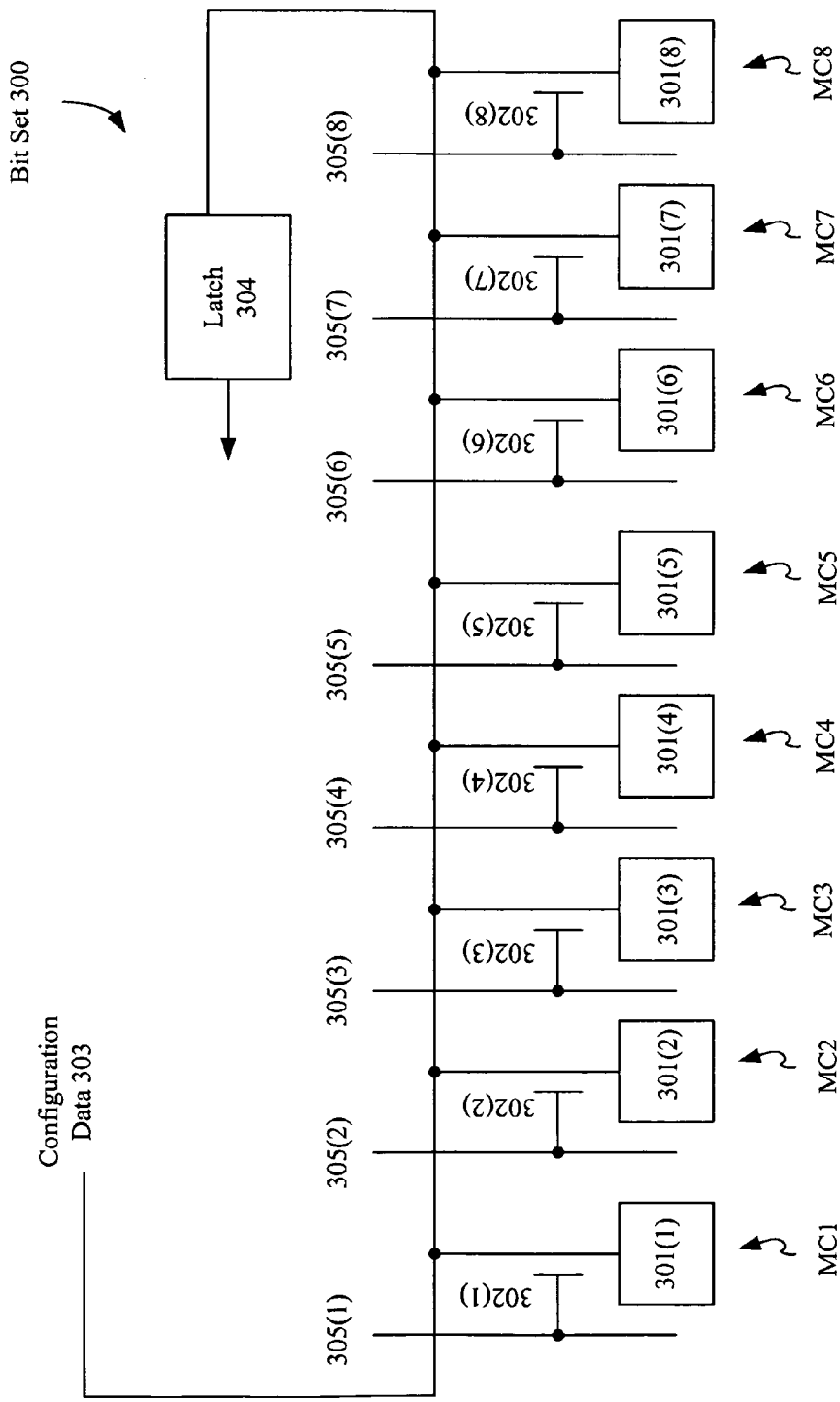
FIG. 3 illustrates another time multiplexing approach for switching between multiple (e.g. eight) configurations.

This time multiplexing technique, which is implemented in the interconnect, has distinct functionality and structural features compared to the techniques described in reference to FIGS. 2 and 3. Specifically, the time multiplexed interconnect does not need additional configuration memory arrays or bit sets to increase functionality. Instead, the time multiplexed interconnect can use a single (i.e. static) configuration memory in a time dependent manner to achieve different functionality at different points in time.

In general, a technique for time multiplexing the interconnect of an FPGA includes reviewing a design netlist to identify nets that can be merged. Note that a netlist describes all structural features of a design, i.e. like a schematic, but in code form. Then, the identified nets can be merged to form the shared interconnect. At this point, the new, smaller netlist can be placed and routed with the appropriate constraints on the sources and destinations.

Figure 5A:
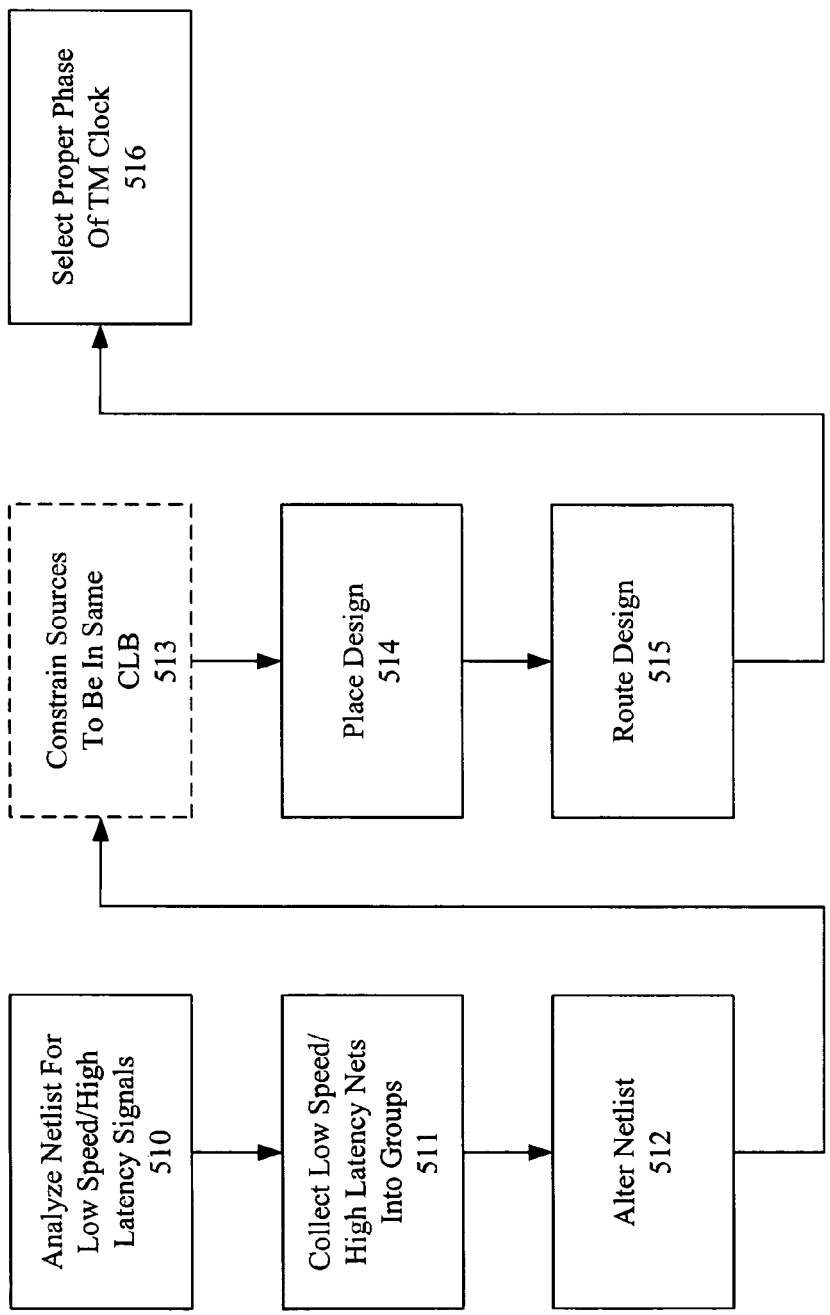
FIG. 5A illustrates one flow chart for time multiplexing the interconnect.

FIG. 5A illustrates a flow chart of one embodiment to time multiplex the interconnect of an FPGA. In step 510, the design netlist can be analyzed for low-speed (or high latency) signals. In step 511, the nets associated with those low-speed (or high latency) signals can be collected into shared interconnect groups. In step 512, the netlist can be modified. Specifically, for each selection device and associated shared interconnect, a net can be built with all destinations in the group. Additionally, all sources could be connected to the selection device.

In optional step 513, the sources could be constrained to be in the same CLB. As indicated previously, the sources could be in separate CLBs. However, certain optimizations can be realized by placement of the sources in the same CLB. For example, less additional wire would be needed to route the signals together. Moreover, the selection device (e.g. the multiplexer) could be placed within the CLB rather than in the interconnect, thereby providing more predictable timing from the sources to the multiplexer and thus making it easier to avoid contention. Finally, the phase of the TM clock, which puts the signal onto the shared interconnect, can be more easily controlled inside the CLB.

In step 514, the design can be placed. In step 515, the design can be routed. Note that standard routers can automatically minimize the use of programmable resources. Therefore, even standard routers can further enhance the advantages provided by the multiplexed interconnect. Finally, in step 516, the proper phase of the TM clock can be selected for all signals in the shared interconnect group.

In one embodiment, the TM clock can be properly timed to ensure that the propagation delays of the signals are matched to their intended destinations. In other words, the TM clock can be varied as needed so that each signal is received at its destination at the appropriate time. In another embodiment, the maximum speed of the TM clock can be timed based on the slowest signal in the interconnect group, i.e. the worst-case delay signal from the TM multiplexer to its destination.

In one embodiment, if time critical signals are not propagated on the shared interconnect, then the TM clock need not run faster than the system clock, thereby easing performance constraints on the FPGA. In another embodiment, if critical signals are propagated on the shared interconnect, then the TM clock can run faster than the system clock. Note that in such cases, the system clock typically already has a low speed requirement. Advantageously, the tradeoffs of time multiplexing critical or non-critical signals on the shared interconnect can be made in the place and route software with standard timing constraints.

Note that fan-outs in a design typically slow down their respective signal paths. Therefore, for an existing fan-out in a design (which is probably already reserved for non-critical signal propagation), adding time multiplexing to the shared interconnect can be implemented without unduly slowing down the overall design.

Figure 5B:
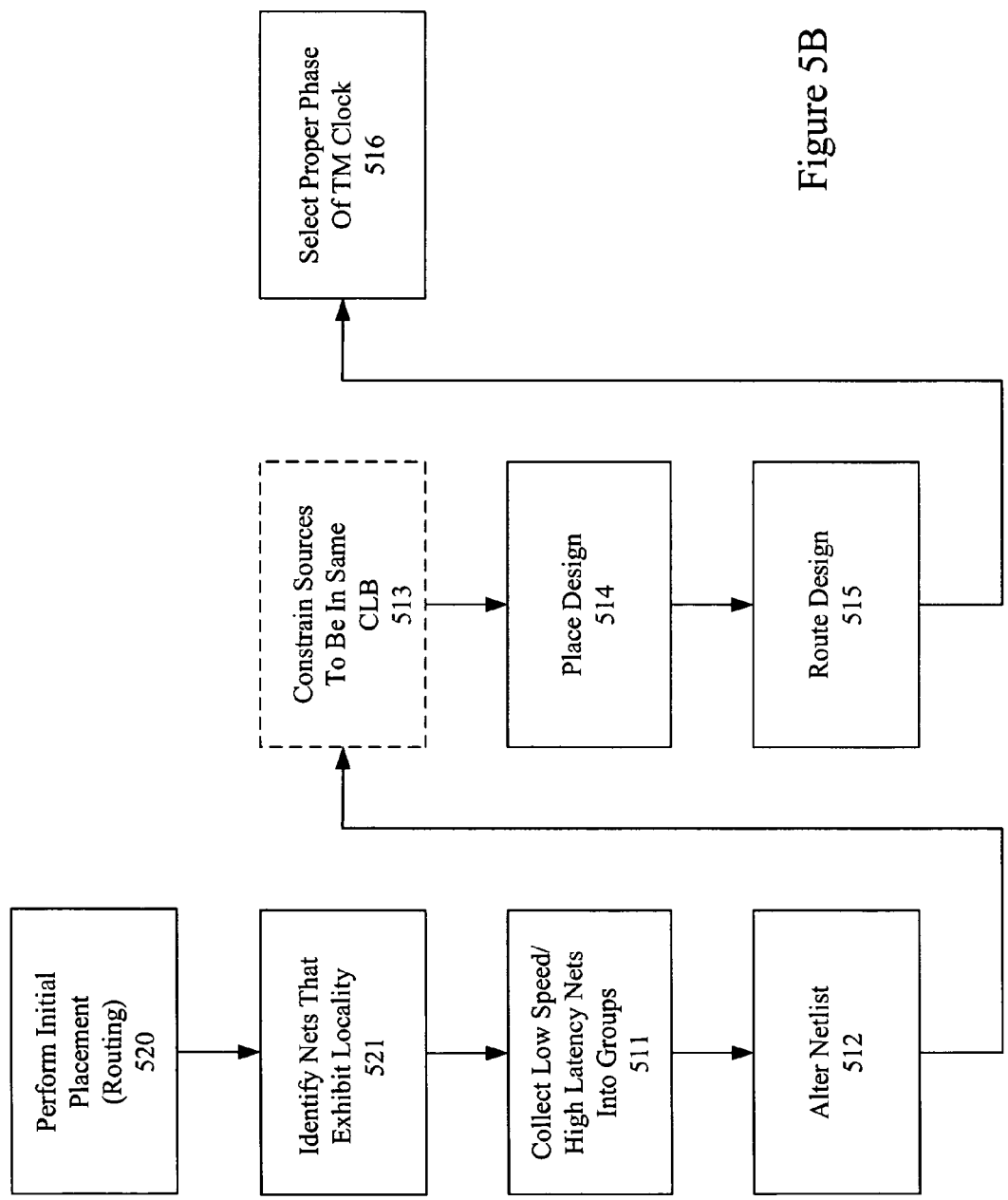
FIG. 5B illustrates another flow chart for time multiplexing the interconnect.

In one embodiment shown in FIG. 5B, an initial placement and an optional routing can be performed in step 520 without time multiplexing being considered. In this manner, nets that naturally exhibit locality for time multiplexing can be identified in step 521. In other words, an initial placement could indicate that two sources have associated interconnect in substantially the same area of the FPGA. In such a case, a shared net can be identified. Note that the timing of the output signals from those sources, e.g. their latency, can be considered. In other words, for those signals that would arrive late anyway, such signals could be delayed by using a late phase of the TM clock without significant negative impact on design functionality. At this point, steps 511–516 can be performed as previously described in reference to FIG. 5A.

Figure 6:
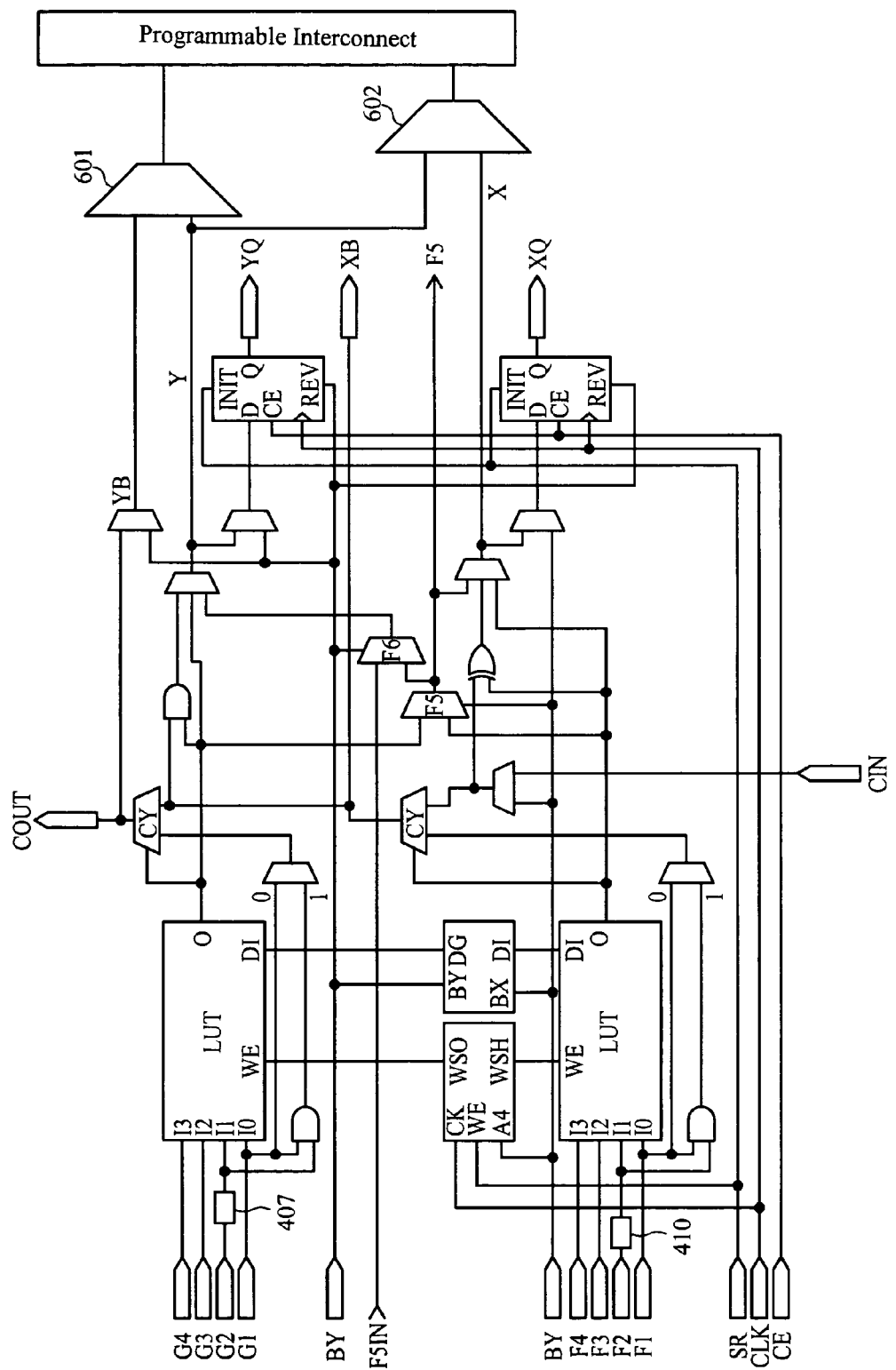
FIG. 6 illustrates a portion of a CLB including two selection devices for implementing time multiplexed interconnect.

FIG. 6 illustrates a portion of a CLB provided in the Virtex™-E FPGA, which is sold by Xilinx, Inc. Two possible locations for the selection device are shown. Specifically selection device 602 can receive the CLB output signals X and Y, whereas a selection device 601 can receive the CLB output signals Y and YQ. Note that other embodiments of the selection device could receive different CLB output signals. Although other multiplexers are provided in the CLB, the selection device(s) are controlled by the TM clock, not a system or user's clock. As indicated previously, the TM clock also controls the capture devices in the destinations. FIG. 6 illustrates exemplary capture devices 407 and 410, which can be respectively located on the G2 and F2 inputs of the LUTs in the CLB. In this manner, the shared interconnect can be multiplexed for multiple sources sending signals to multiple destinations. Note that one or more selection devices can be placed within one CLB.

The present invention is described above in reference to various embodiments. Variations and modifications to those embodiments will be apparent to those skilled in the art. For example, in one embodiment, multiplexing can have any number of phases. Thus, a design could have many multiplexed signals, wherein not all multiplexed signals need to have the same number of different phases. In other words, some multiplexed signals could have 2:1 phases, whereas some multiplexed signals could have 5:1 phases. In another embodiment, the capture devices and selection devices could have different locations from those shown herein. In yet another embodiment, capture devices or selection devices could be limited to a subset of the signals or a subset of the devices. In another embodiment, initial placement and low-criticality analysis could be combined to choose which signals are to be combined. In yet another embodiment, various software algorithms or tools could be use for placement and routing. For example, additional timing analysis tools or logic generating tools could be included in the software flow. Moreover, restrictions could be placed on signals to prevent (or force) them to be time-multiplexed. In another embodiment, different ways could be used to indicate the data phase (e.g. using a global phase bus or reset signal for synchronization). In yet another embodiment, a phase ID or signal ID could be broadcast to all multiplexed devices or on the shared interconnect. In another embodiment, additional logic can be included to compare or compute the time-multiplexed clock phase at each destination. Therefore, the present invention is limited only by the appended claims.

The invention claimed is:

1. A method of propagating signals on programmable interconnect in a programmable logic device, the method comprising:

selecting by a selection device between source signals to drive a shared programmable interconnect portion located on the programmable logic device; and coordinating latching of the source signals in corresponding capture devices via a time multiplexing signal generator coupled to the selection device and the capture devices; and providing one of the source signals from the time multiplexing signal generator to one or more flip flops without a clock delay.

2. The method of claim 1, wherein the source signals are provided by a configurable logic block in the programmable logic device.

3. The method of claim 1, wherein the source signals are provided by configurable logic blocks in the programmable logic device.

4. The method of claim 1, wherein the capture devices are provided in a configurable logic block in the programmable logic device.

5. The method of claim 1, wherein the capture devices are provided in configurable logic blocks in the programmable logic device.

6. The method of claim 1, wherein the capture devices comprise latches.

7. The method of claim 1 further comprising:
connecting the selecting device to the capture devices using a programmable interconnect point.

8. A method of propagating signals in a programmable logic device, the method comprising:
selecting by a selection device between source signals to route signals onto a shared programmable interconnect on the programmable logic device;

routing signals from the shared programmable interconnect to the capture devices through a first programmable interconnect point; and controlling by a clock applied to the selection device and capture devices the provision of the source signals through the selection device to the capture devices, wherein a first one of the signals is latched to a first one of the capture devices during a first phase of the time multiplexing signal and a second one of the signals is latched to a second one of the capture devices during a second phase of the time multiplexing signal.

9. The system of claim 8, wherein the capture devices comprise latches.

10. The method of claim 8, wherein additional programmable interconnect points connect the first programmable interconnect point to the capture devices.

11. A configured programmable logic device comprising:
a multiplexer which chooses between source signals to drive a shared programmable interconnect on the programmable logic device;

flip flops which receive the source signals from the shared programmable interconnect; and a clock which is coupled to the multiplexer and flip flops and provides one of the source signals from the multiplexer to one or more of the flip flops without a clock delay.

12. The method of claim 11, wherein the multiplexer is connected to the flip flops by a first programmable interconnect point.

13. The method of claim 12, wherein additional programmable interconnect points connect the first programmable interconnect point to the flip flops.

14. The method of claim 1, wherein coordinating latching further comprises:
latching a first one of the source signals to a first capture device during a first phase of the time multiplexing signal; and latching a second one of the source signals to a second capture device during a second phase of the time multiplexing signal.

15. The method of claim 1, further comprising receiving by each capture device of the time multiplexing signal on a D input terminal of the capture device.

16. The method of claim 1, further comprising:
receiving by a first one of the capture devices the time multiplexing signal; and receiving by a second one of the capture devices an inversion of the time multiplexing signal.

17. The method of claim 1, wherein the time multiplexing signal generator comprises one of a single A/B switch signal, a multi-bit bus and a simple clock signal with a global reset signal indicating a first phase to synchronize the sources.

18. The method of claim 1, wherein the one time multiplexing signal comprises a single frequency signal.

19. The method of claim 11, further comprising:
receiving by a first one of more of the flip flops the one of the source signals; and receiving by a second one or more of the flip flops an inversion of the one of the source signals.

20. The method of claim 11, wherein the clock signal comprises a single frequency signal.

* * * * *